(12) United States Patent
Kim

(10) Patent No.: US 11,621,607 B2
(45) Date of Patent: Apr. 4, 2023

(54) HEAD-UP DISPLAY FOR VEHICLE AND METHOD OF CONTROLLING THE SAME

(71) Applicant: HYUNDAI MOBIS CO., LTD., Seoul (KR)

(72) Inventor: Byung Ki Kim, Yongin-si (KR)

(73) Assignee: HYUNDAI MOBIS CO., LTD., Seoul (KR)

( * ) Notice: Subject to any disclaimer, the term of this patent is extended or adjusted under 35 U.S.C. 154(b) by 776 days.

(21) Appl. No.: 16/674,781

(22) Filed: Nov. 5, 2019

(65) Prior Publication Data
US 2020/0144892 A1    May 7, 2020

(30) Foreign Application Priority Data

Nov. 7, 2018 (KR) .................. 10-2018-0135688

(51) Int. Cl.
| | | |
|---|---|---|
| *H02K 7/11* | (2006.01) | |
| *H02K 7/116* | (2006.01) | |
| *H05K 5/02* | (2006.01) | |
| *H05K 5/00* | (2006.01) | |
| *H05K 5/03* | (2006.01) | |
| *G02B 27/01* | (2006.01) | |
| *B60K 35/00* | (2006.01) | |

(52) U.S. Cl.
CPC ....... *H02K 7/1166* (2013.01); *G02B 27/0149* (2013.01); *H05K 5/0017* (2013.01); *H05K 5/0217* (2013.01); *H05K 5/0226* (2013.01); *H05K 5/03* (2013.01); *B60K 35/00* (2013.01); *B60K 2370/1529* (2019.05); *B60K 2370/67* (2019.05); *G02B 2027/0163* (2013.01)

(58) Field of Classification Search
CPC .......... H02K 7/1166; G02B 2027/0163; G02B 27/0149; H05K 5/0226; H05K 5/0017; H05K 5/0217; H05K 5/03
See application file for complete search history.

(56) References Cited

U.S. PATENT DOCUMENTS

| | | | |
|---|---|---|---|
| 2006/0164801 A1 | 7/2006 | Yoo | |
| 2015/0146299 A1* | 5/2015 | Koseki | ............... G02B 27/0149 |
| | | | 359/632 |
| 2016/0025973 A1* | 1/2016 | Guttag | .................. B60K 35/00 |
| | | | 345/7 |

FOREIGN PATENT DOCUMENTS

| | | |
|---|---|---|
| CN | 101716918 | 6/2010 |
| CN | 207942995 | 10/2018 |

(Continued)

OTHER PUBLICATIONS

English Language Abstract of CN 10116918 published Jun. 2, 2010.
(Continued)

*Primary Examiner* — Roy P Rabindranath
(74) *Attorney, Agent, or Firm* — DLA Piper LLP (US)

(57) ABSTRACT

Disclosed are a head-up display for a vehicle and a method of controlling the same. The head-up display may include a casing unit, a hinge unit rotatably mounted on the casing unit, a holder unit mounted on the hinge unit, wherein a combiner is positioned on the holder unit, an actuation unit coupled to the hinge unit and configured to rotate the hinge unit, a detection unit configured to detect an initial location of the hinge unit, and a controller configured to receive a detection signal of the detection unit and drive the actuation unit. Accordingly, precise control of the combiner may be possible although only the initial location of the hinge unit is detected.

13 Claims, 17 Drawing Sheets

(56) References Cited

FOREIGN PATENT DOCUMENTS

KR        10-1558658  B1    10/2015
WO    WO 2018/068860         4/2018

OTHER PUBLICATIONS

English Language Abstract of CN 207942995 published Oct. 9, 2018.
Chinese Office Action dated Sep. 28, 2022 issued in 201911075324.0.

\* cited by examiner

HEAD-UP DISPLAY FOR VEHICLE AND METHOD OF CONTROLLING THE SAME

CROSS-REFERENCE TO RELATED APPLICATION

The present application claims priority under 35 U.S.C. § 119(a) to Korean Patent Application No. 10-2018-0135688 filed on Nov. 7, 2018 in the Korean Intellectual Property Office, which is incorporated herein by reference in its entirety.

BACKGROUND

1. Technical Field

Embodiments of the present disclosure relate to a head-up display for a vehicle and a method of controlling the same, and more particularly, to a head-up display for a vehicle, which can reduce a production cost and enables a precise combiner operation by applying a sensor for detecting only the initial location of a combiner and a method of controlling the head-up display.

2. Related Art

In general, a head-up display (hereinafter, referred to as an "HUD") is a system that enables a driver to check vehicle information while continuously keeping eyes forward while driving a vehicle by displaying various types of vehicle information on the wind shield glass of the vehicle in the form of a virtual image.

A combiner type HUD is configured in such a manner that the combiner is received in a vehicle and deployed if necessary. The HUD is divided into a horizontal type combiner HUD and a vertical type combiner HUD depending on the deployment of an optical device according to the space where the HUD is mounted within a vehicle.

In the vertical type combiner HUD, a combiner is vertically moved and deployed by the rotation of a cam wheel. Accordingly, the vertical type combiner HUD has a problem in that a cost rises because a sensor for detecting a rotational displacement for the entire area of the combiner is applied to the combiner. Accordingly, there is a need to improve the problem.

The Background Art of the present disclosure is disclosed in Korean Patent No. 10-1558658 (Oct. 1, 2015) entitled "Head Up Display Device for Vehicle."

SUMMARY

Various embodiments are directed to the provision of an HUD for a vehicle, which can reduce a production cost and enables a precise combiner operation by applying a sensor for detecting only the initial location of the combiner and a method of controlling the same.

In an embodiment, a head-up display (HUD) for a vehicle includes a casing unit, a hinge unit rotatably mounted on the casing unit, a holder unit mounted on the hinge unit, wherein a combiner is positioned on the holder unit, an actuation unit coupled to the hinge unit and configured to rotate the hinge unit, a detection unit configured to detect an initial location of the hinge unit, and a controller configured to receive a detection signal of the detection unit and drive the actuation unit.

The hinge unit includes a hinge cover unit coupled to the casing unit and a hinge shaft unit rotatable through the hinge cover unit and coupled to the holder unit.

The holder unit includes a holder body unit, a holder mounting unit formed in the holder body unit, wherein the combiner is mounted on the holder mounting unit, and a holder cover unit formed in the holder body unit and coupled to the hinge shaft unit.

The actuation unit includes an actuation motor unit mounted on the hinge cover unit, an actuation gear unit coupled to the hinge shaft unit, wherein a gear is formed in the outer circumference of the actuation gear unit, and an actuation transfer unit configured to transfer the driving force of the actuation motor unit to the actuation gear unit.

The actuation transfer unit includes a first gear unit engaged and rotated with the actuation motor unit, a second gear unit engaged and rotated with the first gear unit, and a third gear unit engaged and rotated with the second gear unit and engaged with the actuation gear unit.

The detection unit includes a sensor mounted on the hinge cover unit and a sensing protrusion unit mounted on the hinge shaft unit, having a cam shape and configured to turn on the sensor when the combiner is closed.

In an embodiment, the HUD for a vehicle further includes an elastic unit mounted on the hinge unit and configured to elastically support the holder unit.

In an embodiment, a method of controlling an HUD for a vehicle includes setting an initial location of a combiner by determining an on or off of a detection unit configured to detect a location of a hinge shaft unit operating in conjunction with the combiner, opening the combiner from the initial location to a previous final location, and closing the combiner from the final location to the initial location.

The setting of the initial location includes determining the on or off of the detection unit when power is initially applied, making on the detection unit by rotating an actuation unit in a close direction of the combiner if the detection unit is off, making off the detection unit by rotating the actuation unit by a set quantity in an open direction of the combiner if the detection unit is on and making on the detection unit again by rotating the actuation unit at a set speed in the close direction of the combiner, and setting a point, at which the detection unit becomes from off to on within the set time, as the initial location.

The method further includes determining that an error has occurred and stopping the actuation unit, if the detection unit becomes from off to on out of the set time or the detection unit maintains an off state within the set time.

The opening of the combiner includes rotating the actuation unit at a set speed in an open direction of the combiner at the initial location, determining whether the detection unit becomes off within a set time by the rotation of the actuation unit, performing a tilting operation up to the previous final location if the detection unit becomes off within the set time, and stopping the actuation unit if the tilting operation is completely performed.

The opening of the combiner further includes determining whether the initial location of the combiner has been set and setting the initial location if the initial location has not been set.

The opening of the combiner further includes determining that an error has occurred and stopping the actuation unit, if the detection unit becomes off out of the set time or the detection unit maintains an on state within the set time.

The closing of the combiner includes determining whether the detection unit becomes off, rotating the actuation unit at a set speed in a close direction of the combiner at the final location if the detection unit becomes off, determining whether the detection unit becomes on within the set time, and stopping the actuation unit if the detection unit becomes on.

The determining of whether the detection unit becomes off includes setting the initial location if the detection unit becomes on.

The closing of the combiner further includes determining that an error has occurred and stopping the actuation unit, if the detection unit becomes on out of the set time or the detection unit maintains an off state within the set time.

DETAILED DESCRIPTION

Hereinafter, embodiments of a head-up display (HUD) for a vehicle and a method of controlling the same will be described in detail with reference to the accompanying drawings. In describing the present disclosure, a detailed description of a related known function or configuration will be omitted if it is deemed to make the gist of the present disclosure unnecessarily vague. Furthermore, terms to be described hereunder have been defined by taking into consideration functions in the present disclosure, and may be different depending on a user, an operator's intention or practice. Accordingly, each term should be defined based on contents over the entire specification.

Figure 1:
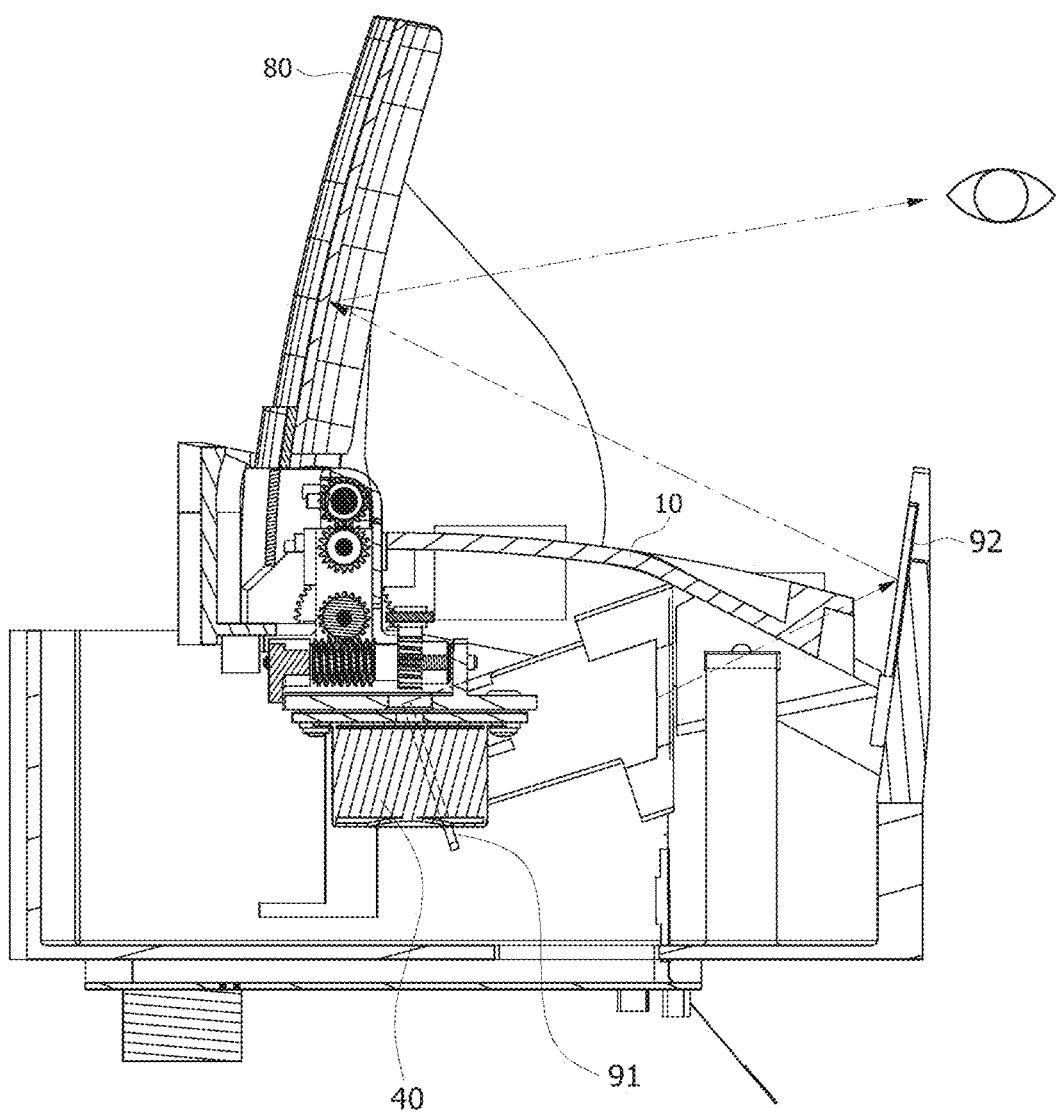
FIG. 1 is a diagram schematically illustrating an HUD for a vehicle according to an embodiment of the present disclosure.
Figure 2:
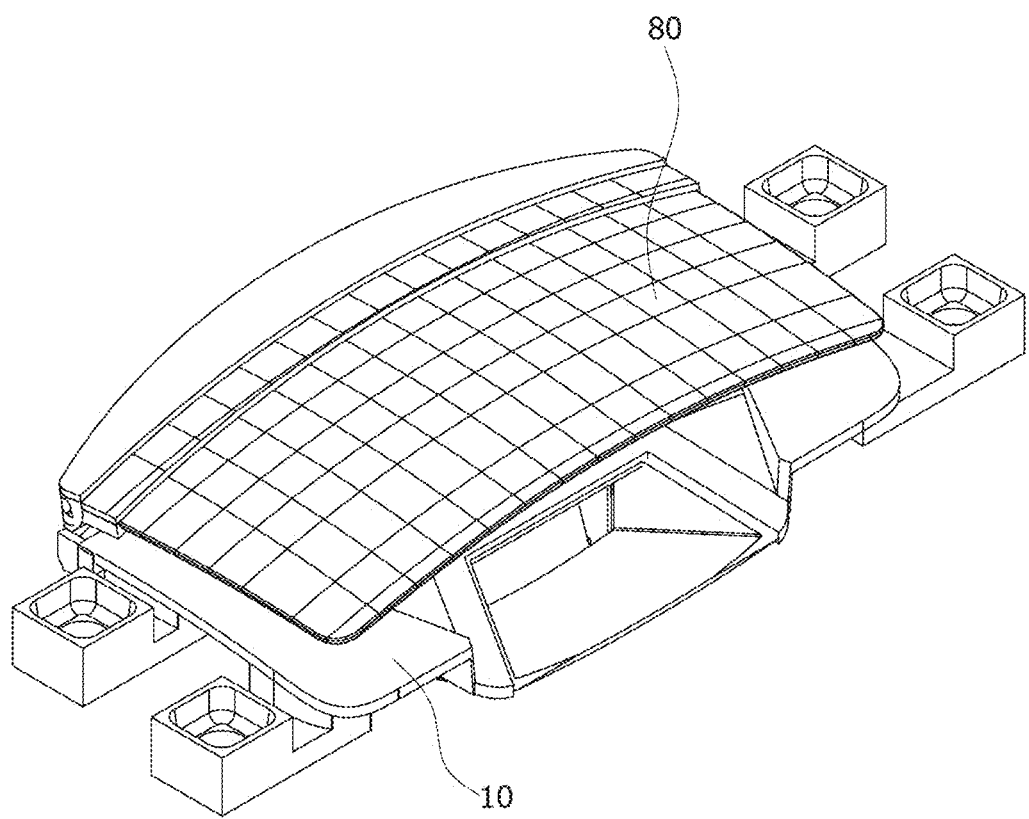
FIG. 2 is a diagram schematically illustrating the close state of a combiner according to an embodiment of the present disclosure.
Figure 3:
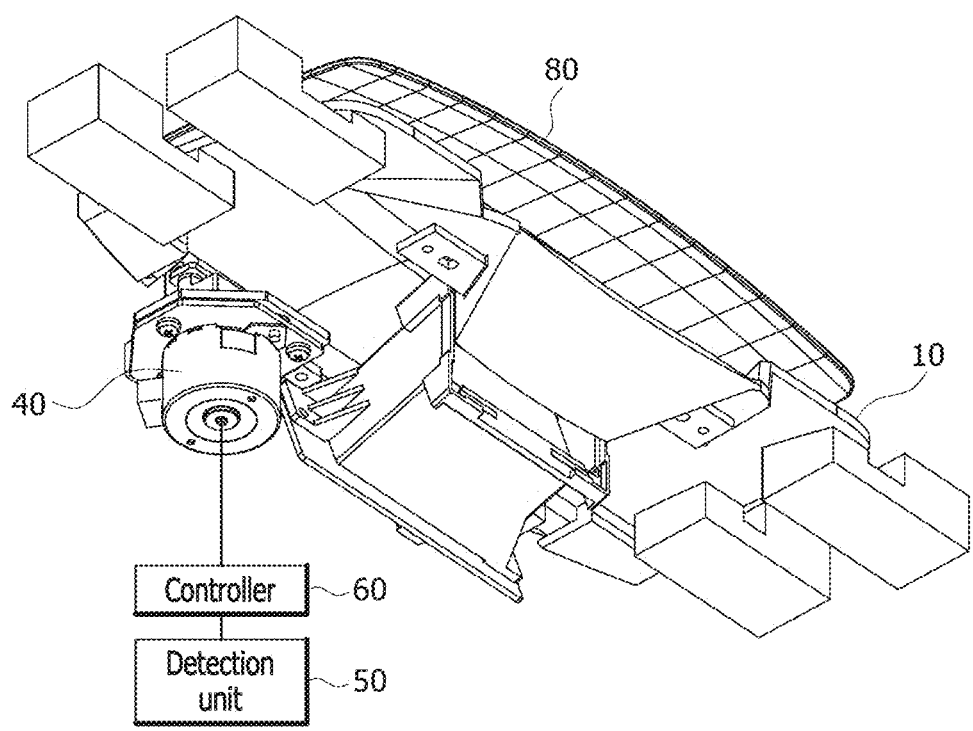
FIG. 3 is a perspective view illustrating the bottom of the combiner of FIG. 2.
Figure 4:
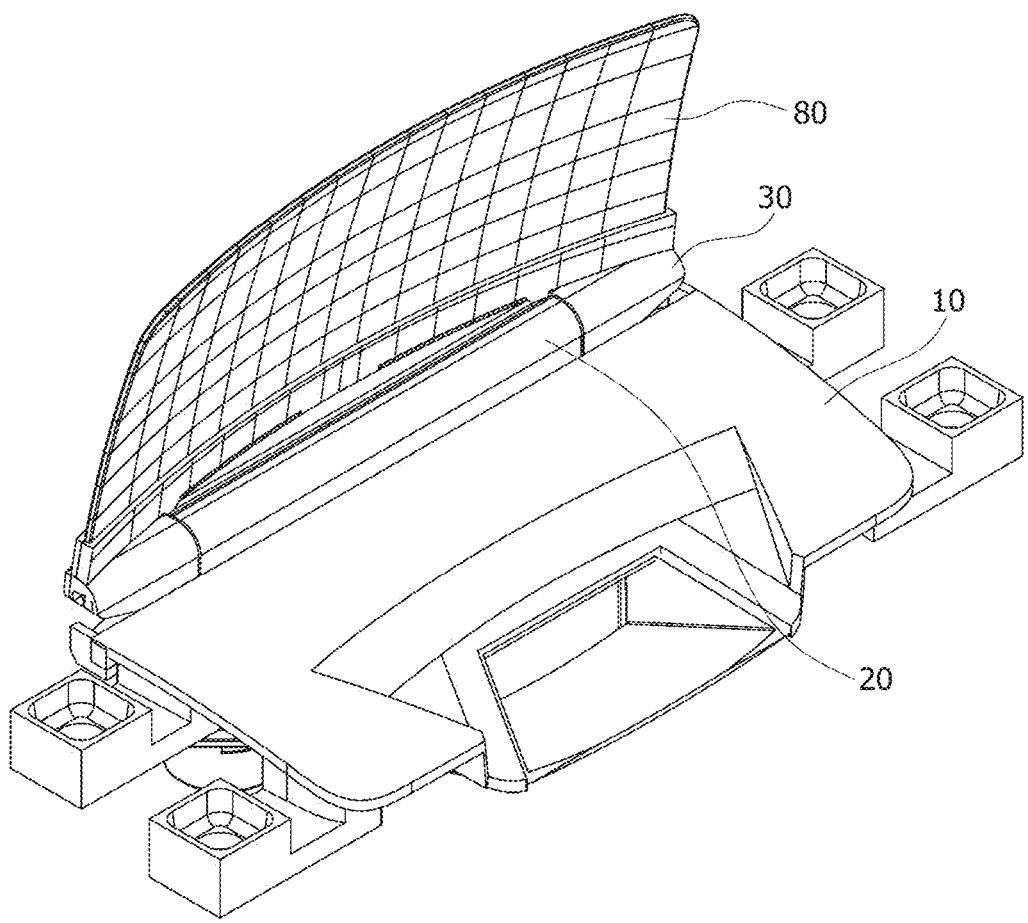
FIG. 4 is a diagram schematically illustrating the open state of the combiner according to an embodiment of the present disclosure.

FIG. 1 is a diagram schematically illustrating an HUD 1 for a vehicle according to an embodiment of the present disclosure. FIG. 2 is a diagram schematically illustrating the close state of a combiner according to an embodiment of the present disclosure. FIG. 3 is a perspective view illustrating the bottom of the combiner of FIG. 2. FIG. 4 is a diagram schematically illustrating the open state of the combiner according to an embodiment of the present disclosure. Referring to FIGS. 1 to 4, the HUD 1 for a vehicle according to an embodiment of the present disclosure includes a casing unit 10, a hinge unit 20, a holder unit 30, an actuation unit 40, a detection unit 50, and a controller 60.

The casing unit 10 is mounted on a vehicle. An image generator 91 is positioned in the casing unit 10. The image generator 91 generates an image or video, and projects an image signal onto an optical unit 92 positioned in the casing unit 10. Furthermore, the optical unit 92 leads the image signal, provided by the image generator 91, to a combiner 80 by controlling a light path.

The hinge unit 20 is mounted on the casing unit 10. For example, the hinge unit 20 may be positioned over the casing unit 10, and the combiner 80 may be received over the casing unit 10.

The holder unit 30 is mounted on the hinge unit 20. The combiner 80 is positioned on the holder unit 30. Accordingly, as the holder unit 30 is rotated by the hinge unit 20, the combiner 80 is rotated and thus may become a close state or an open state. In this case, in the open state, the combiner 80 reflects an image signal so that a driver can recognize the image signal.

The actuation unit 40 is coupled to the hinge unit 20 and rotates the hinge unit 20. For example, the actuation unit 40 is coupled to the hinge unit 20 by a gear. When the hinge unit 20 is rotated in one direction, the combiner 80 becomes the open state. When the hinge unit 20 is rotated in the other direction, the combiner 80 may become the close state.

The detection unit 50 detects the initial location of the hinge unit 20. For example, the detection unit 50 does not detect a rotational displacement for the entire area of the hinge unit 20, but may detect only the initial location of the hinge unit 20. In this case, the initial location of the hinge unit 20 may be the close state of the combiner 80. The detection unit 50 may become on or off by physical pressurization because a relatively cheap limit switch sensor is used as the detection unit.

The controller 60 receives a detection signal from the detection unit 50 and controls the actuation unit 40. For example, when the controller 60 receives a detection signal from the detection unit 50 and drives the actuation unit 40, the hinge unit 20 may rotate, and thus the combiner 80 may be open or close.

Figure 5:
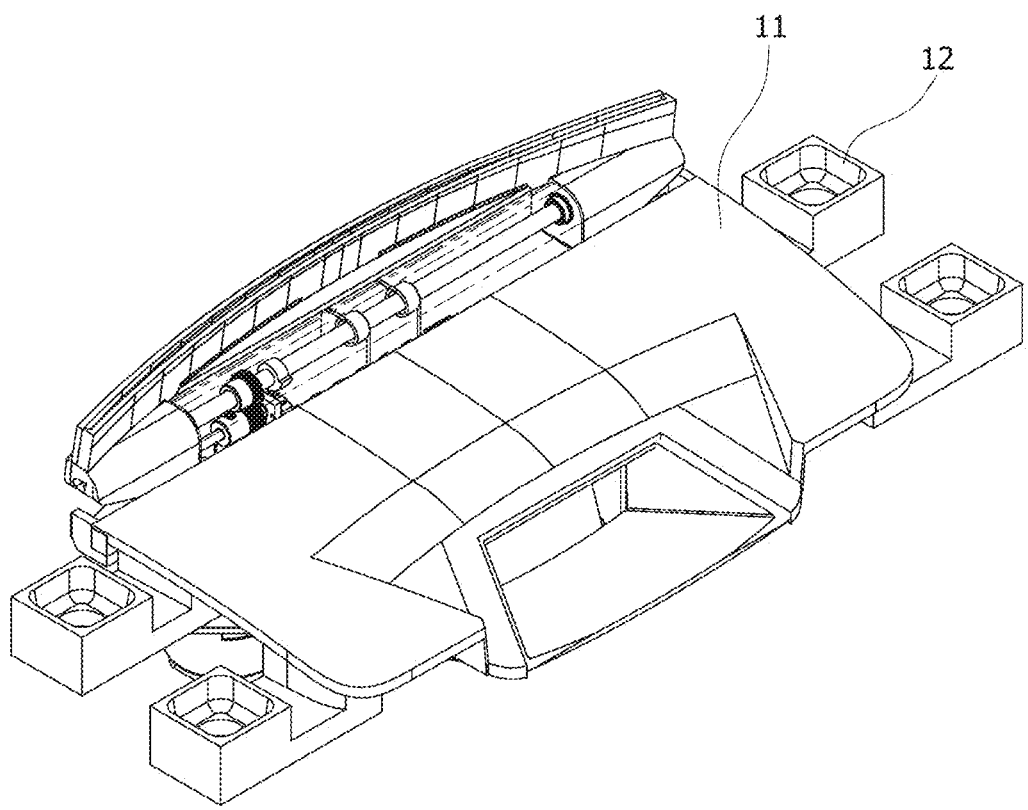
FIG. 5 is a diagram schematically illustrating a casing unit according to an embodiment of the present disclosure.

FIG. 5 is a diagram schematically illustrating the casing unit according to an embodiment of the present disclosure. Referring to FIG. 5, the casing unit 10 according to an embodiment of the present disclosure includes a casing plate unit 11 and a casing coupling unit 12. The casing plate unit 11 may be positioned over the casing unit 10. The image generator 91 may be positioned under the casing plate unit 11. The casing coupling unit 12 may be extended from the edge of the casing plate unit 11 and fixed to a vehicle body.

Figure 6:
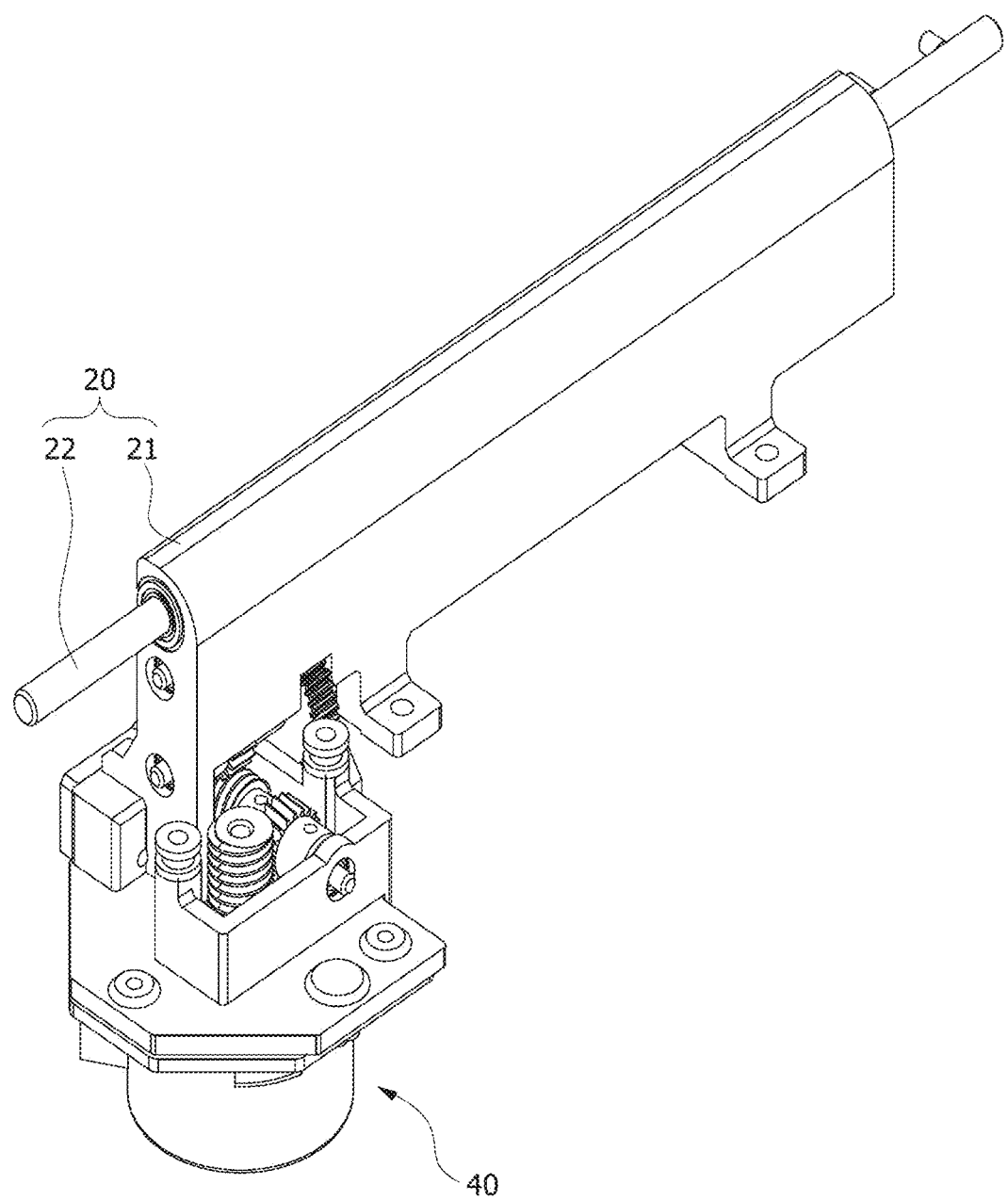
FIG. 6 is a diagram schematically illustrating a hinge unit according to an embodiment of the present disclosure.
Figure 7:
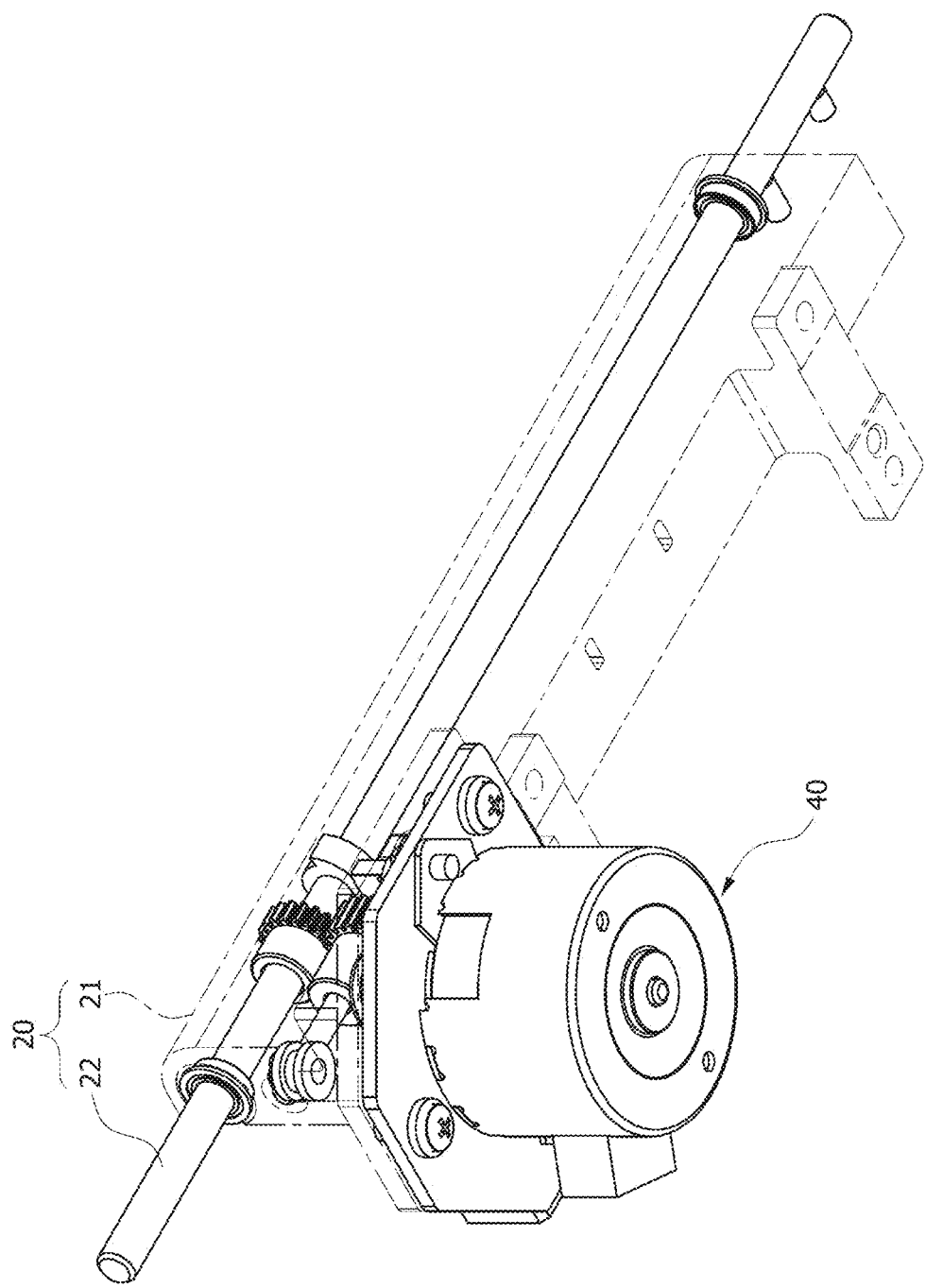
FIG. 7 is a perspective view illustrating the bottom of the hinge unit of FIG. 6.

FIG. 6 is a diagram schematically illustrating the hinge unit according to an embodiment of the present disclosure. FIG. 7 is a perspective view illustrating the bottom of the hinge unit of FIG. 6. Referring to FIGS. 6 and 7, the hinge unit 20 according to an embodiment of the present disclosure includes a hinge cover unit 21 and a hinge shaft unit 22.

The hinge cover unit 21 is coupled to the casing unit 10. The hinge shaft unit 22 may rotate through the hinge cover unit 21, and is coupled to the holder unit 30. For example, the hinge shaft unit 22 is longer than the hinge cover unit 21, and may penetrate through the end of the hinge cover unit 21. Both ends of the hinge shaft unit 22 are exposed to the outside, and may have angular shapes.

Figure 8:
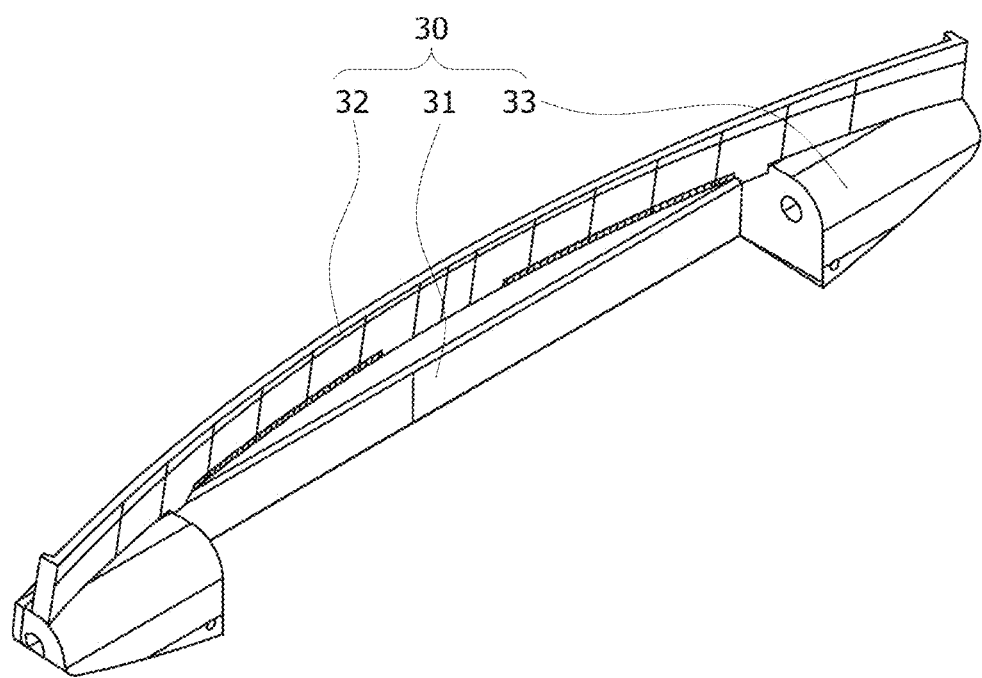
FIG. 8 is a diagram schematically illustrating a holder unit according to an embodiment of the present disclosure.
Figure 9:
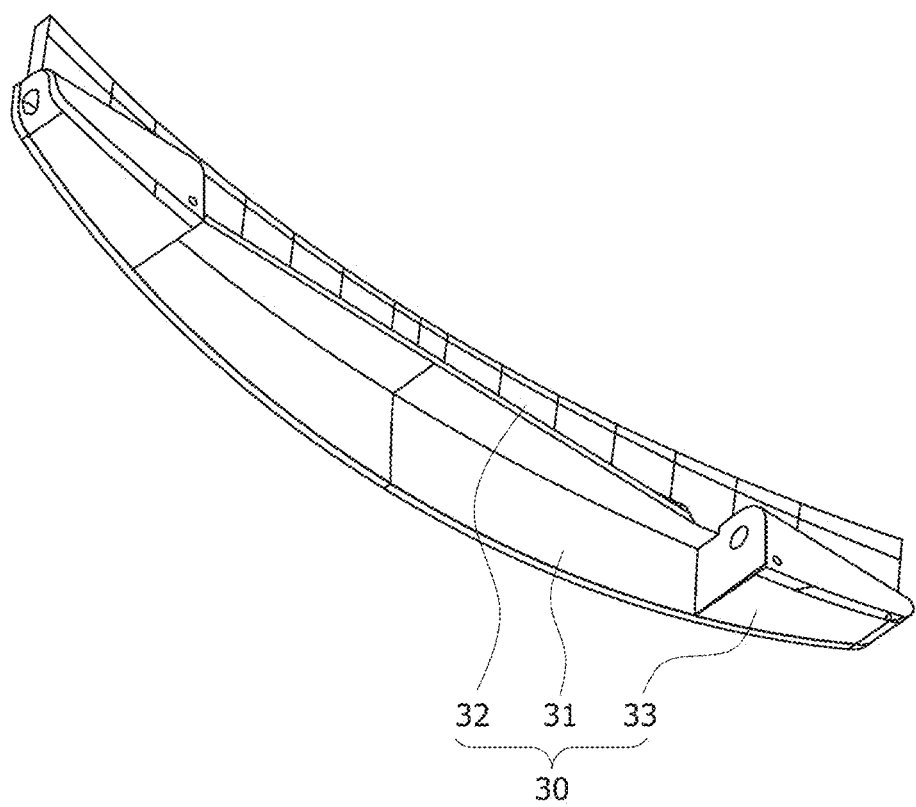
FIG. 9 is a perspective view illustrating the back of the holder unit of FIG. 8.

FIG. 8 is a diagram schematically illustrating the holder unit according to an embodiment of the present disclosure. FIG. 9 is a perspective view illustrating the back of the holder unit of FIG. 8. Referring to FIGS. 8 and 9, the holder unit 30 according to an embodiment of the present disclosure includes a holder body unit 31, a holder mounting unit 32, and a holder cover unit 33.

The holder body unit 31 is formed to have a length in the length direction of the hinge unit 20. For example, the holder body unit 31 has a length in the width direction of the casing plate unit 11, and may be formed longer than the hinge shaft unit 22.

The holder mounting unit 32 is formed in the holder body unit 31. The combiner 80 is mounted on the holder mounting unit 32. For example, the holder mounting unit 32 is formed in the length direction of the holder body unit 31. A groove may be formed in the holder mounting unit 32 so that the combiner 80 is inserted into the groove.

The holder cover unit 33 is formed in the holder body unit 31 and formed to surround the hinge shaft unit 22. For example, the holder cover unit 33 is integrated with the holder body unit 31. Both ends of the hinge shaft unit 22 may be inserted into the holder cover unit 33. The holder cover unit 33 is coupled to the hinge shaft unit 22, and may operate in conjunction with the hinge shaft unit 22.

Figure 10:
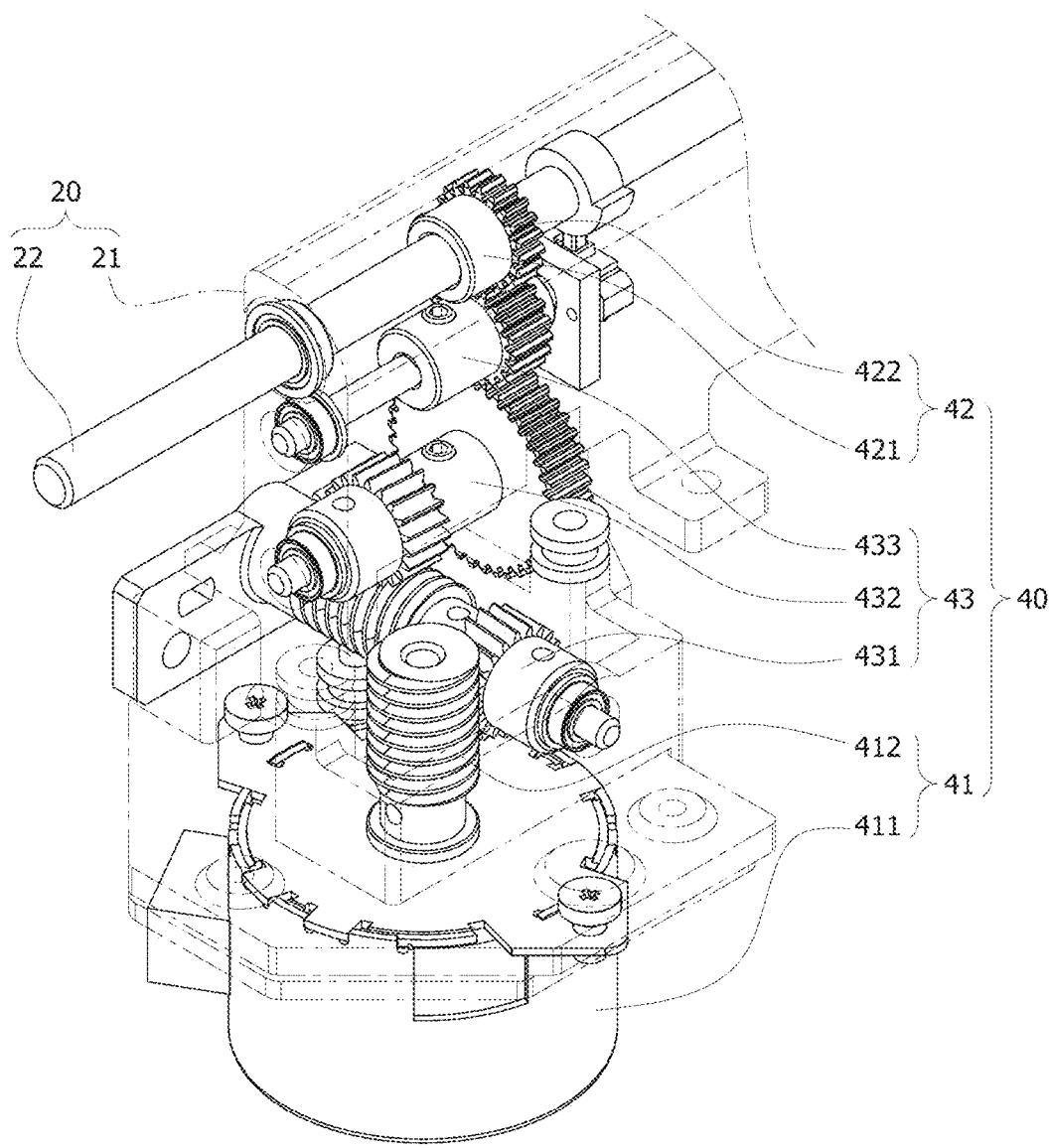
FIG. 10 is a diagram schematically illustrating an actuation unit according to an embodiment of the present disclosure.

FIG. 10 is a diagram schematically illustrating the actuation unit according to an embodiment of the present disclosure. Referring to FIG. 10, the actuation unit 40 according to an embodiment of the present disclosure includes an actuation motor unit 41, an actuation gear unit 42, and an actuation transfer unit 43.

The actuation motor unit 41 may be directly coupled to the hinge cover unit 21 or may be connected to the hinge cover unit 21. For example, the actuation motor unit 41 may include a motor driving unit 411 driven when power is applied and a motor worm gear unit 412 rotated by the motor driving unit 411.

The actuation gear unit 42 is coupled to the hinge shaft unit 22. A gear is formed in the outer circumference of the actuation gear unit 42. For example, the actuation gear unit 42 may include a first actuation gear unit 421 coupled to the outer circumference of the hinge shaft unit 22 and having a ring shape and a second actuation gear unit 422 formed on the outer circumference of the first actuation gear unit 421.

The actuation transfer unit 43 transfers the driving force of the actuation motor unit 41 to the actuation gear unit 42. More specifically, the actuation transfer unit 43 includes a first gear unit 431, a second gear unit 432, and a third gear unit 433.

The first gear unit 431 is engaged and rotated with the actuation motor unit 41. For example, the first gear unit 431 may be rotatably mounted on the hinge cover unit 21, and a part thereof may be engaged and rotated with the motor worm gear unit 412.

The second gear unit 432 is engaged and rotated with the first gear unit 431. For example, the second gear unit 432 is rotatably mounted on the hinge cover unit 21 and positioned over the first gear unit 431. A part of the second gear unit 432 may be engaged and rotated with the first gear unit 431 in a worm gear manner.

The third gear unit 433 is engaged and rotated with the second gear unit 432, and is engaged with the actuation gear unit 42. For example, the third gear unit 433 is rotatably mounted on the hinge cover unit 21, and is positioned between the actuation gear unit 42 and the second gear unit 432. The third gear unit 433 may be engaged with the actuation gear unit 42 and the second gear unit 432 in a spur gear connection manner, thus being capable of transferring electric power.

Figure 11:
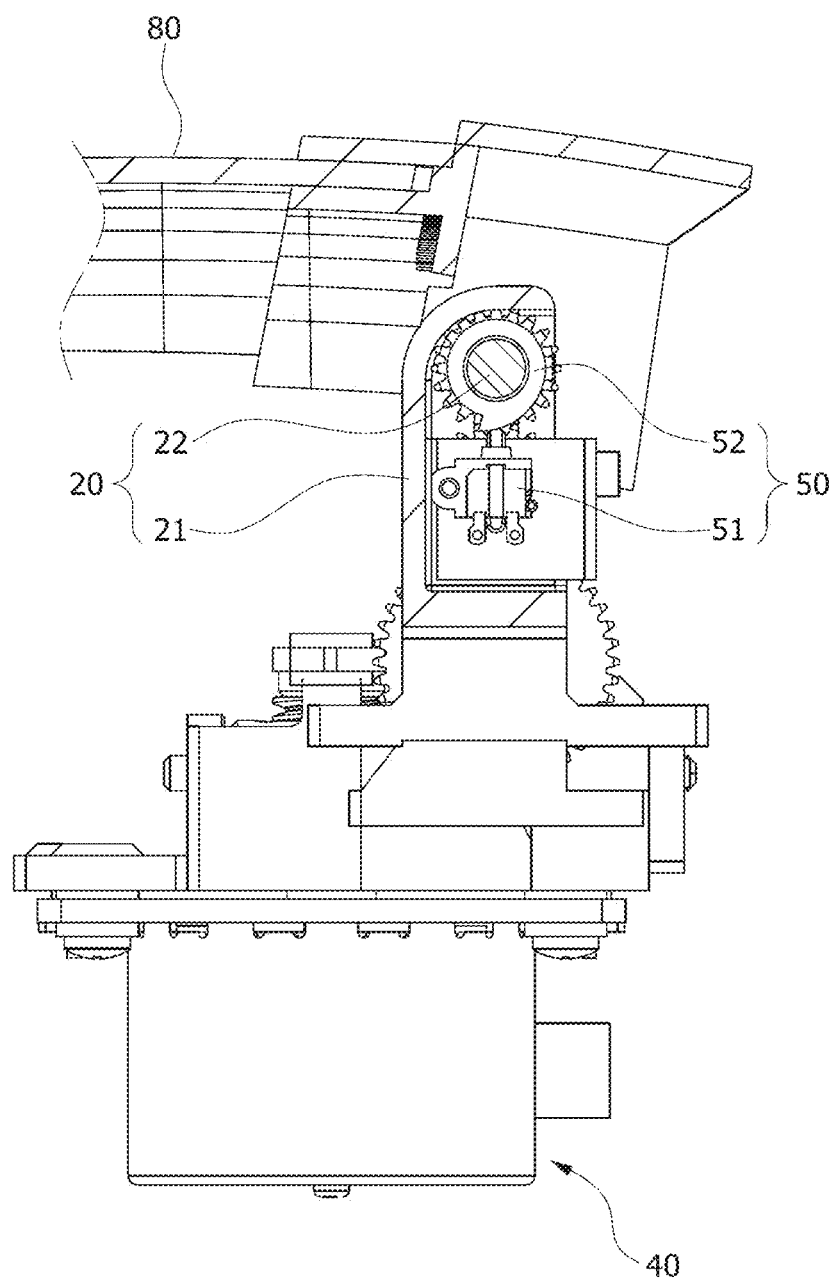
FIG. 11 is a diagram schematically illustrating the on state of a detection unit according to an embodiment of the present disclosure.
Figure 12:
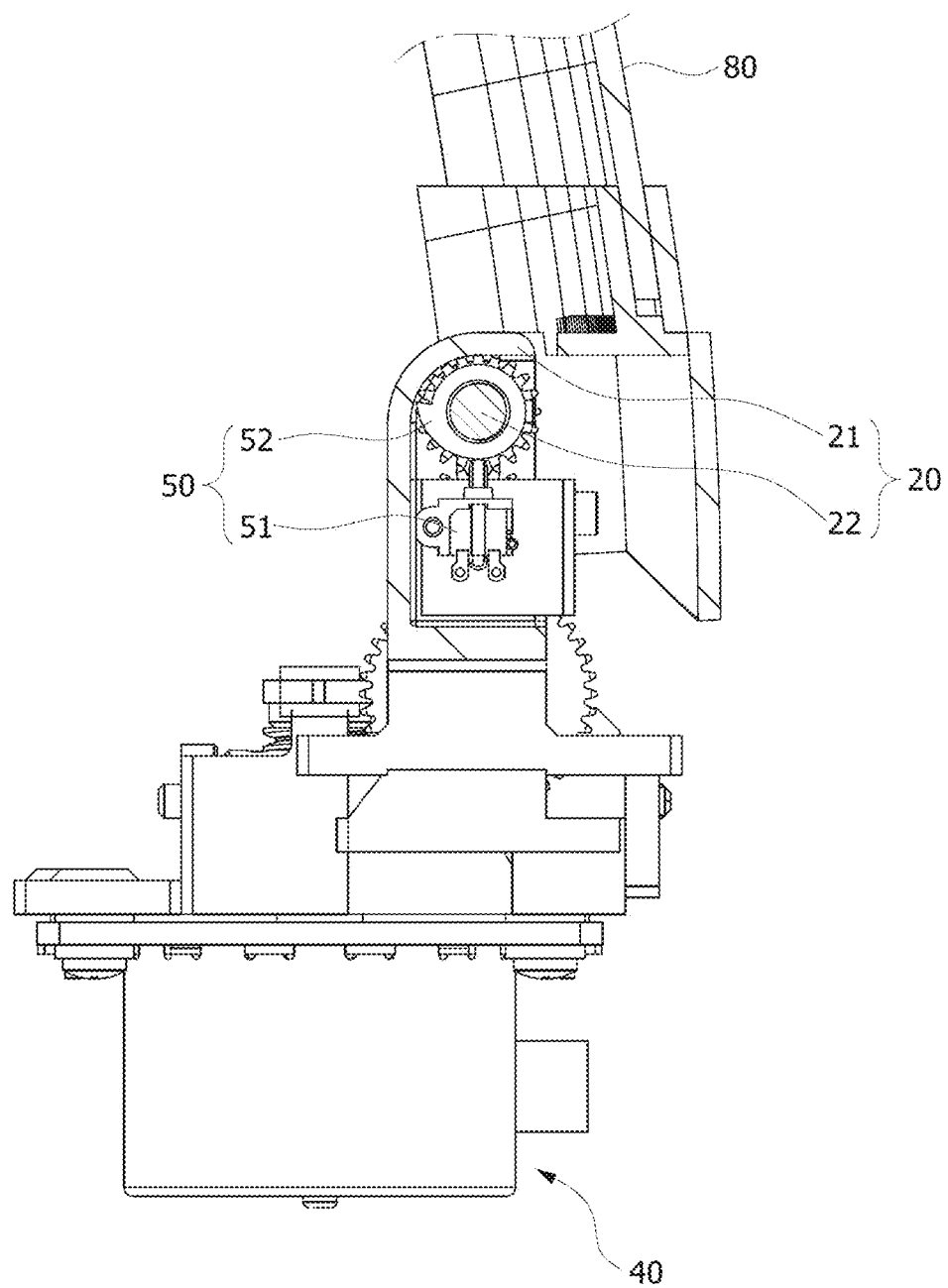
FIG. 12 is a diagram schematically illustrating the off state of the detection unit according to an embodiment of the present disclosure.

FIG. 11 is a diagram schematically illustrating the on state of the detection unit according to an embodiment of the present disclosure. FIG. 12 is a diagram schematically illustrating the off state of the detection unit according to an embodiment of the present disclosure. Referring to FIGS. 11 and 12, the detection unit 50 according to an embodiment of the present disclosure includes a sensor 51 and a sensing protrusion unit 52.

The sensor 51 is mounted on the hinge cover unit 21. The sensing protrusion unit 52 is mounted on the hinge shaft unit 22. The sensing protrusion unit 52 has a cam shape so that an external diameter thereof at any point is increased. Accordingly, when the combiner 80 is closed, the sensing protrusion unit 52 may turn on the sensor 51. For example, when the combiner 80 is the close state, a portion outward protruding from the sensing protrusion unit 52 may press the sensor 51, that is, a switch sensor.

Figures 13, 14:
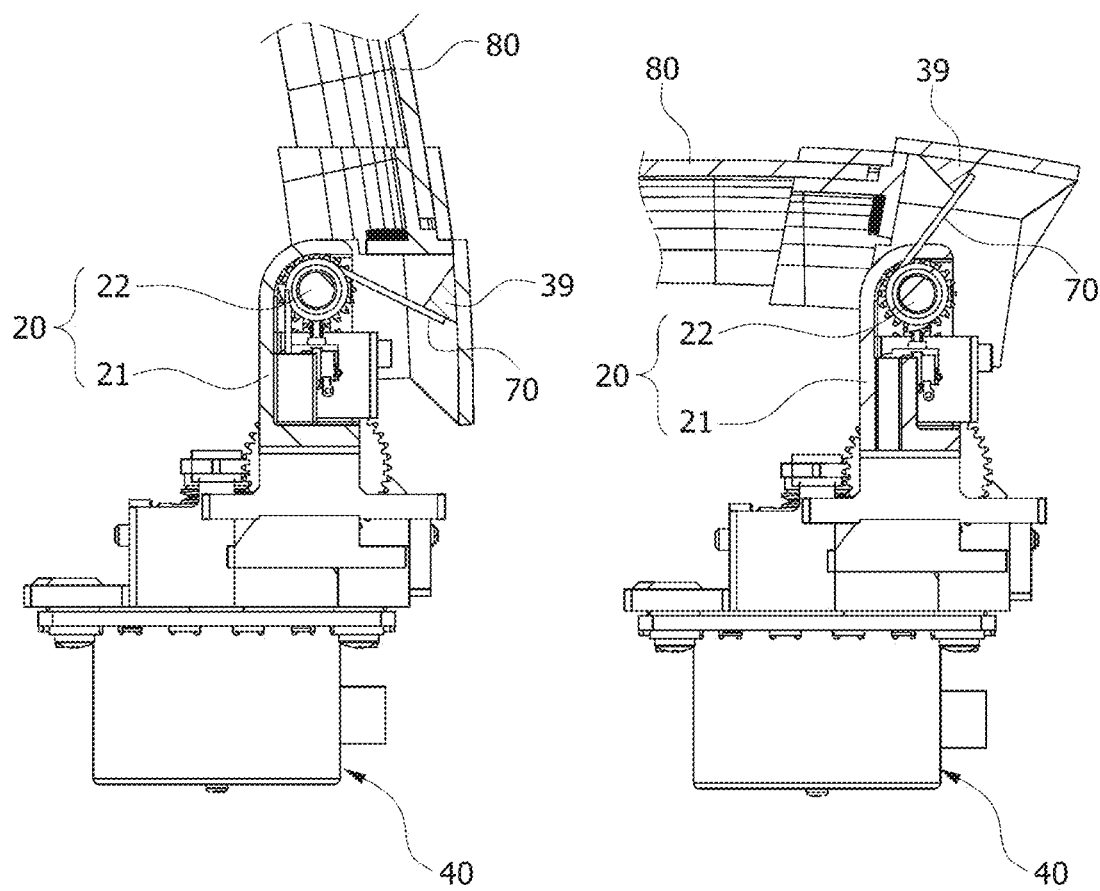
FIG. 13 is a diagram schematically illustrating an elastic unit in the open state of the combiner according to an embodiment of the present disclosure.
FIG. 14 is a diagram schematically illustrating the elastic unit in the close state of the combiner according to an embodiment of the present disclosure.

FIG. 13 is a diagram schematically illustrating an elastic unit in the open state of the combiner according to an embodiment of the present disclosure. FIG. 14 is a diagram schematically illustrating the elastic unit in the close state of the combiner according to an embodiment of the present disclosure. Referring to FIGS. 13 and 14, the elastic unit 70 is mounted on the hinge unit 20 and elastically supports the holder unit 30. For example, one or more elastic units 70 are mounted on the hinge shaft unit 22. One end of the elastic unit 70 may be supported by the hinge cover unit 21, and the other end thereof may always come into contact with the holder unit 30. The other end of the elastic unit 70 may be caught by a holder protrusion unit 39, formed in the holder unit 30, in the open or close state of the combiner 80, thereby preventing a clearance and vibration.

Figure 15:
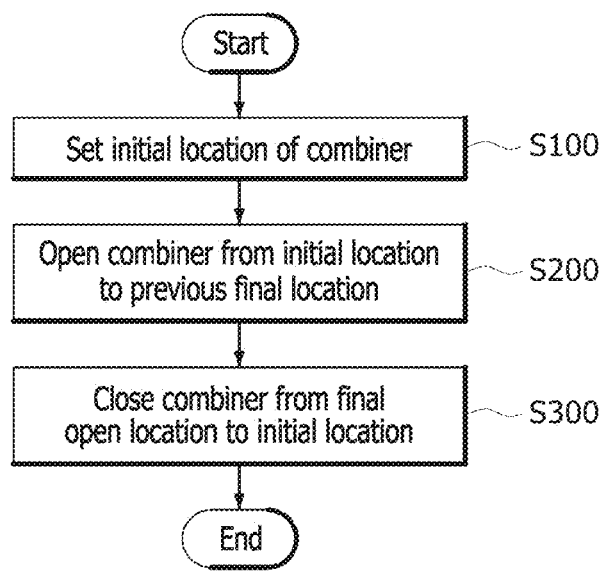
FIG. 15 is a diagram schematically illustrating a method of controlling the HUD for a vehicle according to an embodiment of the present disclosure.

FIG. 15 is a diagram schematically illustrating a method of controlling the HUD for a vehicle according to an embodiment of the present disclosure. The method of controlling the HUD for a vehicle will be described below with reference to FIG. 15.

First, the controller 60 sets the initial location of the combiner 80 by determining the on or off of the detection unit 50 that detects the location of the hinge shaft unit 22 operating in conjunction with the combiner 80 (S100). For example, when the sensing protrusion unit 52 of the detection unit 50 presses the sensor 51 while rotating in a cam shape, the sensor 51 may become an on state. When the detection unit 50 is in the on state, the combiner 80 may become a close state.

Thereafter, the combiner 80 is open from the initial location to a previous final location (S200). Finally, after the combiner 80 is open, the combiner 80 is closed from the final location to the initial location (S300). For example, the final location of the combiner 80 may mean a location where the combiner 80 is open and thus a driver can obtain driving information through the combiner 80.

The actuation unit 40 may rotate the combiner 80 by a set quantity, at a set speed or for a set time under the control of the controller 60. In this case, the set quantity, set speed and set time may be different depending on the design, and may be input to the actuation unit 40 when a product is fabricated.

Figure 16:
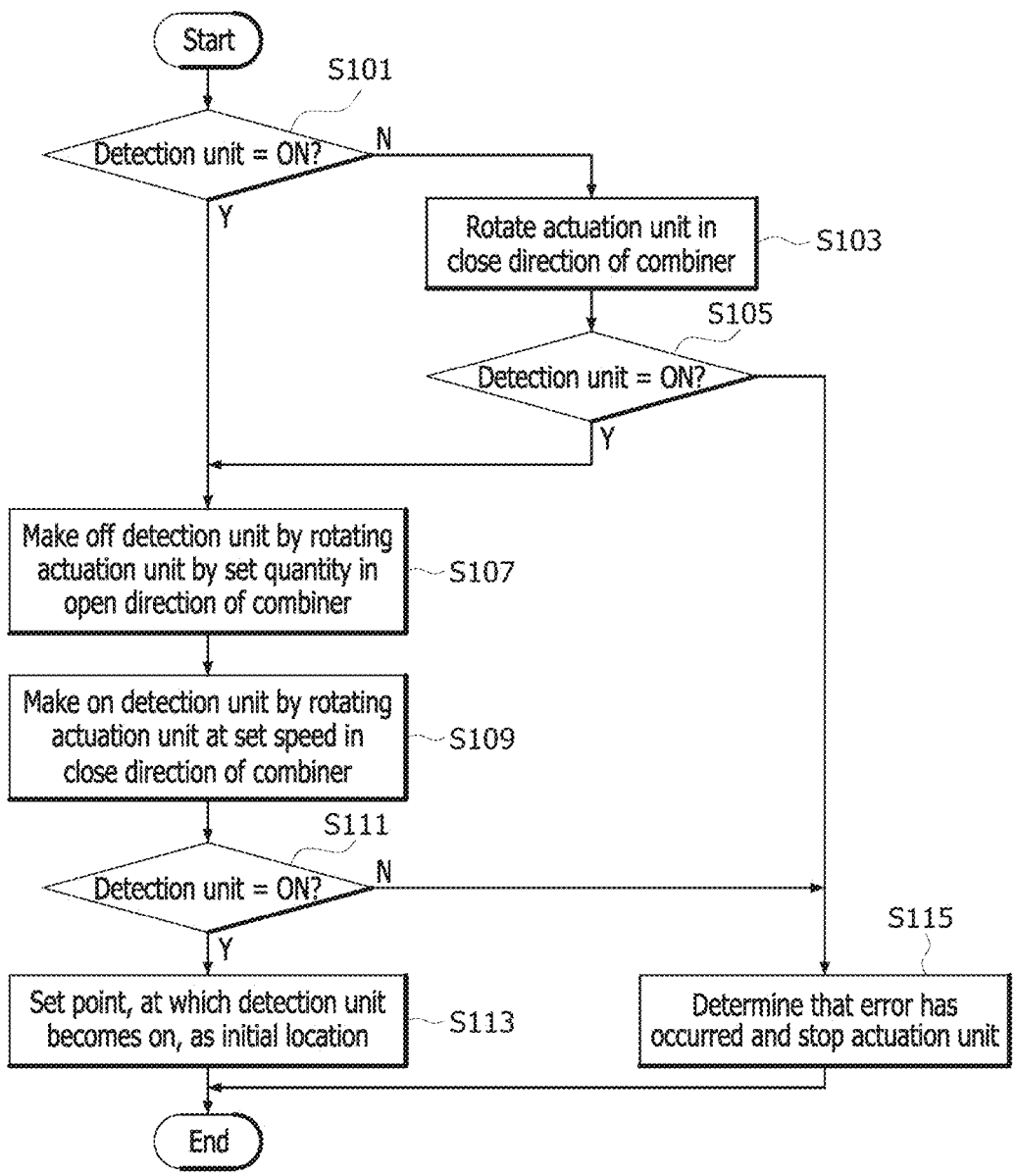
FIG. 16 is a diagram schematically illustrating a method of setting the initial location of the combiner in the method of controlling the HUD for a vehicle according to an embodiment of the present disclosure.

FIG. 16 is a diagram schematically illustrating a method of setting the initial location of the combiner in the method of controlling the HUD for a vehicle according to an embodiment of the present disclosure. A process of setting the initial location will be schematically described below with reference to FIG. 16.

First, when power is initially applied, the on or off of the detection unit 50 is determined (S101). If the detection unit 50 becomes off, the detection unit 50 becomes on by rotating the actuation unit 40 in the close direction of the combiner 80 (S103 and S105). Furthermore, if the detection unit 50 becomes on, the detection unit 50 becomes off by rotating the actuation unit 40 by a set quantity in the open direction of the combiner 80 (S107). Thereafter, the detection unit 50 becomes on by rotating the actuation unit 40 at a set speed in the close direction of the combiner 80 (S109). Finally, a point at which the detection unit 50 becomes from off to on within a set time is set as an initial location (S111 and S113).

If the detection unit 50 becomes from off to on out of the set time or the detection unit 50 maintains an off state within the set time, the controller 60 determines that an error has occurred and stops the actuation unit 40 (S115).

Figure 17:
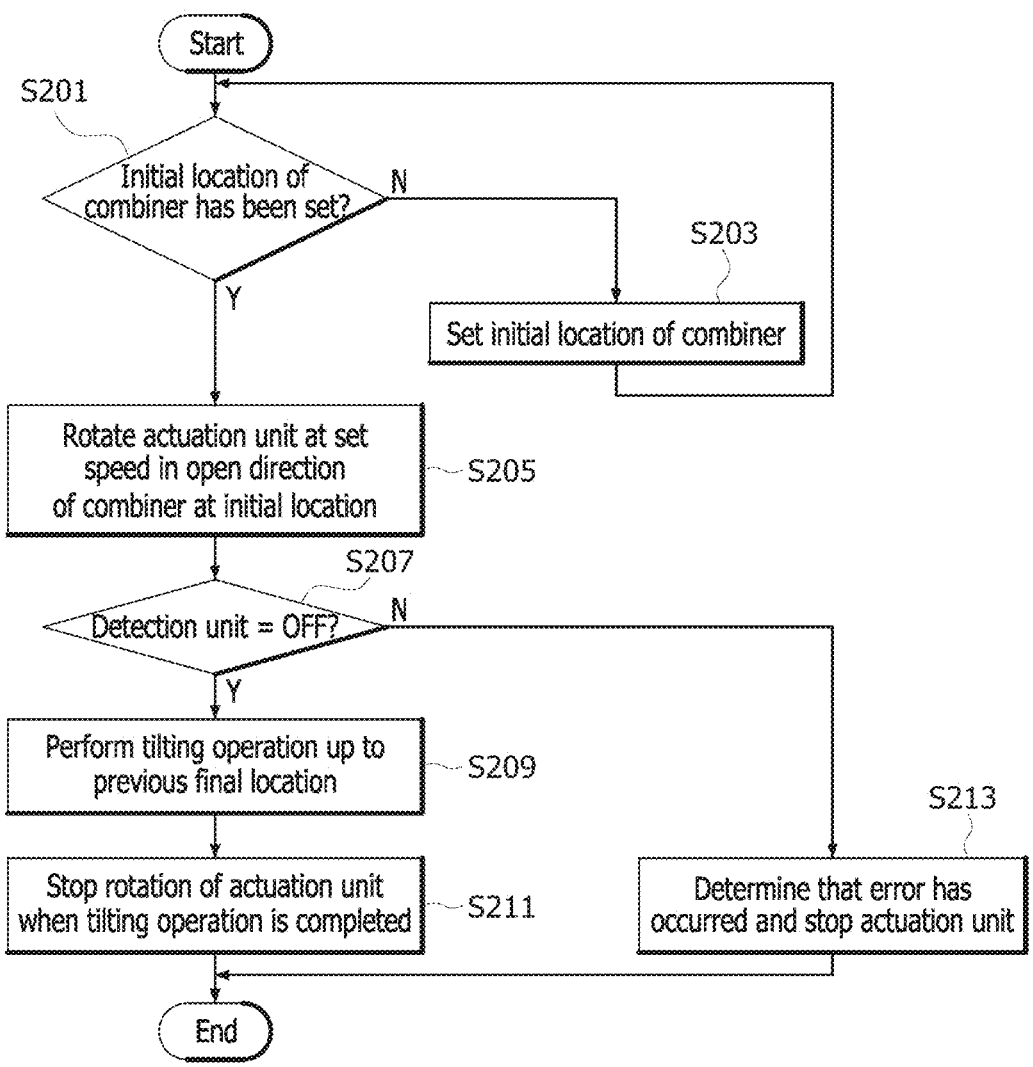
FIG. 17 is a diagram schematically illustrating a method of opening the combiner in the method of controlling the HUD for a vehicle according to an embodiment of the present disclosure.

FIG. 17 is a diagram schematically illustrating a method of opening the combiner in the method of controlling the HUD for a vehicle according to an embodiment of the present disclosure. A process of opening the combiner 80 will be described below with reference to FIG. 17.

First, whether the initial location of the combiner 80 has been set is checked (S201). If the initial location of the combiner 80 has not been set, the process proceeds to step S203 of setting the initial location of the combiner 80.

Furthermore, if the initial location of the combiner 80 has been set, the actuation unit 40 is rotated at a set speed in the open direction of the combiner 80 at the initial location (S205). Thereafter, whether the detection unit 50 has become off within a set time by the rotation of the actuation unit 40 is determined (S207).

If the detection unit 50 becomes off within the set time, the actuation unit 40 is driven to perform a tilting operation up to a previous final location (S209). When the tilting operation is completely performed, the actuation unit 40 is stopped (S211).

If the detection unit 50 becomes off out of the set time or the detection unit 50 maintains an on state within the set time, the controller 60 determines that an error has occurred and stops the actuation unit 40 (S213).

Figure 18:
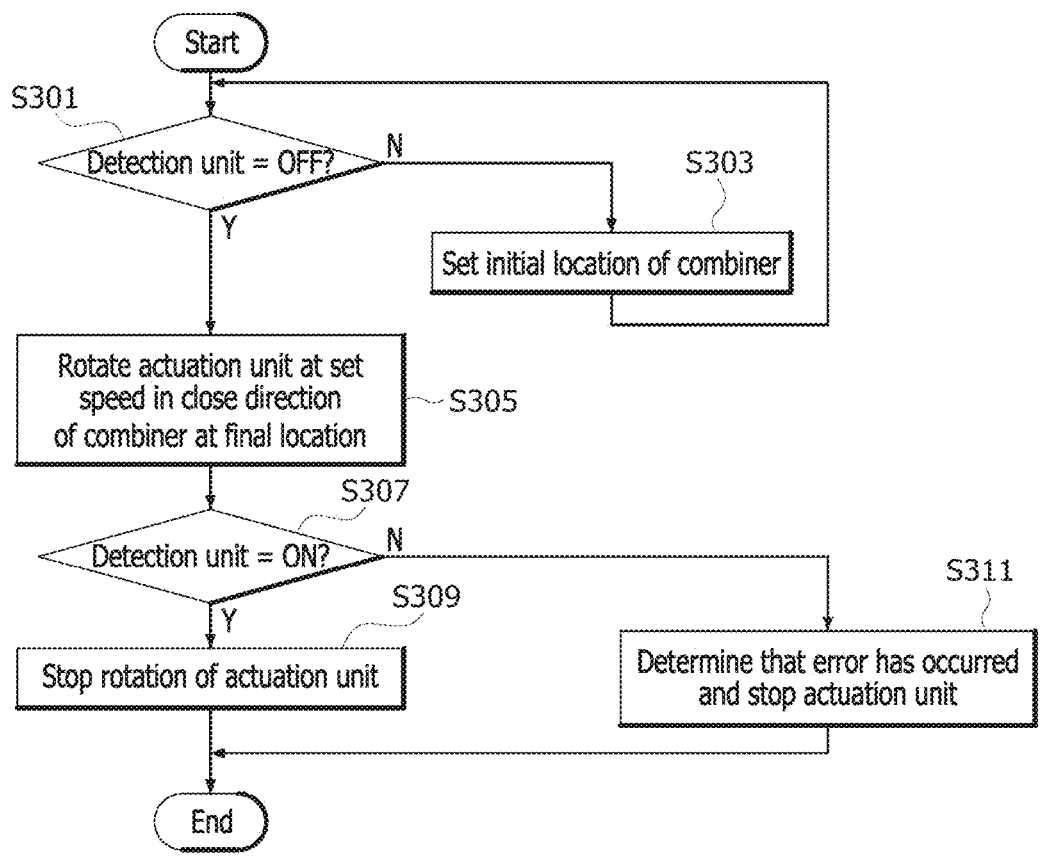
FIG. 18 is a diagram schematically illustrating a method of closing the combiner in the method of controlling the HUD for a vehicle according to an embodiment of the present disclosure.

FIG. 18 is a diagram schematically illustrating a method of closing the combiner in the method of controlling the HUD for a vehicle according to an embodiment of the present disclosure. A process of closing the combiner 80 will be described below with reference to FIG. 18.

First, the controller 60 determines whether the detection unit 50 becomes off (S301). If the detection unit 50 is in an on state, the process proceeds to step S303 of setting the initial location of the combiner 80. Furthermore, if the detection unit 50 becomes off, the actuation unit 40 is rotated at a set speed in the close direction of the combiner 80 at the final location (S305).

After the actuation unit 40 is rotated at the set speed, the controller 60 determines whether the detection unit 50 becomes on within a set time (S307). If the detection unit 50 becomes on, the controller 60 stops the actuation unit 40 (S309). Furthermore, if the detection unit 50 becomes on out of the set time or the detection unit 50 maintains an off state within the set time, the controller 60 determines that an error has occurred and stops the actuation unit 40 (S311).

In the HUD for a vehicle and methods of controlling the same according to embodiments, although the detection unit detects only an initial location, the combiner can be precisely open or closed.

In the HUD for a vehicle and methods of controlling the same according to embodiments, maintenance expenses can be reduced because a cheap limit switch sensor is used.

Although preferred embodiments of the present disclosure have been disclosed for illustrative purposes, those skilled in the art will appreciate that various modifications, additions and substitutions are possible, without departing from the scope and spirit of the present disclosure as defined in the accompanying claims. Thus, the true technical scope of the present disclosure should be defined by the following claims.

What is claimed is:

1. A head-up display (HUD) for a vehicle, comprising:
    a casing unit;
    a hinge unit rotatably mounted on the casing unit;
    a holder unit mounted on the hinge unit, wherein a combiner is positioned on the holder unit, wherein the hinge unit comprises:
        a hinge cover unit coupled to the casing unit, and
        a hinge shaft unit rotatable through the hinge cover unit and coupled to the holder unit;
    a sensor mounted on the hinge cover unit;
    a sensing protrusion unit mounted on the hinge shaft unit, having a cam shape and configured to turn on the sensor when the combiner is closed;
    an actuation unit coupled to the hinge unit and configured to rotate the hinge unit;
    a detection unit configured to detect an initial location of the hinge unit; and
    a controller configured to receive a detection signal of the detection unit and drive the actuation unit.

2. The HUD of claim 1, wherein the holder unit comprises:
    a holder body unit;
    a holder mounting unit formed in the holder body unit, wherein the combiner is mounted on the holder mounting unit; and
    a holder cover unit formed in the holder body unit and coupled to the hinge shaft unit.

3. The HUD of claim 1, further comprising an elastic unit mounted on the hinge unit and configured to elastically support the holder unit.

4. A head-up display (HUD) for a vehicle, comprising:
    a casing unit;
    a hinge unit rotatably mounted on the casing unit;
    a holder unit mounted on the hinge unit, wherein a combiner is positioned on the holder unit;
    an actuation unit coupled to the hinge unit and configured to rotate the hinge unit;
    a detection unit configured to detect an initial location of the hinge unit; and
    a controller configured to receive a detection signal of the detection unit and drive the actuation unit,
wherein the actuation unit comprises:
    an actuation motor unit;

an actuation gear unit coupled to the hinge shaft unit, wherein a gear is formed in an outer circumference of the actuation gear unit; and an actuation transfer unit configured to transfer a driving force of the actuation motor unit to the actuation gear unit.

5. The HUD of claim 4, wherein the actuation transfer unit comprises:

a first gear unit engaged and rotated with the actuation motor unit;

a second gear unit engaged and rotated with the first gear unit; and a third gear unit engaged and rotated with the second gear unit and engaged with the actuation gear unit.

6. A method of controlling an HUD for a vehicle, the method comprising:

setting an initial location of a combiner by determining an on or off of a detection unit configured to detect a location of a hinge shaft unit operating in conjunction with the combiner;

opening the combiner from the initial location to a previous final location; and closing the combiner from the final location to the initial location;

determining whether the detection unit becomes off;

rotating the actuation unit at a set speed in a close direction of the combiner at the final location if the detection unit becomes off;

determining whether the detection unit becomes on within the set time; and stopping the actuation unit if the detection unit becomes on.

7. The method of claim 6, wherein the setting of the initial location comprises:

determining the on or off of the detection unit when power is initially applied;

making on the detection unit by rotating an actuation unit in a close direction of the combiner if the detection unit is off;

making off the detection unit by rotating the actuation unit by a set quantity in an open direction of the combiner if the detection unit is on and making on the detection unit again by rotating the actuation unit at a set speed in the close direction of the combiner; and setting a point, at which the detection unit becomes from off to on within the set time, as the initial location.

8. The method of claim 7, further comprising determining that an error has occurred and stopping the actuation unit, if the detection unit becomes from off to on out of the set time or the detection unit maintains an off state within the set time.

9. The method of claim 6, wherein the opening of the combiner comprises:

rotating the actuation unit at a set speed in an open direction of the combiner at the initial location;

determining whether the detection unit becomes off within a set time by the rotation of the actuation unit;

performing a tilting operation up to the previous final location if the detection unit becomes off within the set time; and stopping the actuation unit if the tilting operation is completely performed.

10. The method of claim 9, wherein the opening of the combiner further comprises:

determining whether the initial location of the combiner has been set; and setting the initial location if the initial location has not been set.

11. The method of claim 9, wherein the opening of the combiner further comprises determining that an error has occurred and stopping the actuation unit, if the detection unit becomes off out of the set time or the detection unit maintains an on state within the set time.

12. The method of claim 6, wherein the closing of the combiner further comprises determining that an error has occurred and stopping the actuation unit, if the detection unit becomes on out of the set time or the detection unit maintains an off state within the set time.

13. The method of claim 6, wherein the determining of whether the detection unit becomes off further comprises setting the initial location if the detection unit becomes on.

* * * * *